(12) United States Patent
Kim et al.

(10) Patent No.: US 12,159,964 B2
(45) Date of Patent: Dec. 3, 2024

(54) LIGHT-EMITTING DIODE DEVICE CONTAINING MICROLENSES AND METHOD OF MAKING THE SAME

(71) Applicant: SAMSUNG ELECTRONICS CO., LTD., Suwon-si (KR)

(72) Inventors: Brian Kim, Santa Clara, CA (US); Ivan Huang, San Jose, CA (US); Saket Chadda, San Jose, CA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 416 days.

(21) Appl. No.: 17/551,578

(22) Filed: Dec. 15, 2021

(65) Prior Publication Data
US 2022/0223769 A1    Jul. 14, 2022

Related U.S. Application Data

(60) Provisional application No. 63/135,154, filed on Jan. 8, 2021.

(51) Int. Cl.
| | | |
|---|---|---|
| *H01L 33/58* | (2010.01) | |
| *H01L 27/15* | (2006.01) | |
| *H01L 33/32* | (2010.01) | |

(52) U.S. Cl.
CPC .......... *H01L 33/58* (2013.01); *H01L 27/156* (2013.01); *H01L 33/32* (2013.01)

(58) Field of Classification Search
CPC ....... H01L 33/58; H01L 27/156; H01L 33/32; H01L 25/0753; H01L 25/167; H01L 33/24
See application file for complete search history.

(56) References Cited

U.S. PATENT DOCUMENTS

| | | |
|---|---|---|
| 8,309,439 B2 | 11/2012 | Seifert et al. |
| 8,664,636 B2 | 3/2014 | Konsek et al. |
| 8,669,574 B2 | 3/2014 | Konsek et al. |
| 9,281,442 B2 | 3/2016 | Romano et al. |
| 9,287,443 B2 | 3/2016 | Konsek et al. |
| 10,276,764 B2 | 4/2019 | Jansen et al. |
| 11,841,508 B2 * | 12/2023 | Mezouari .............. H01L 27/156 |

(Continued)

FOREIGN PATENT DOCUMENTS

| | | |
|---|---|---|
| JP | 2008-216831 A | 9/2008 |
| JP | 2009-272068 A | 11/2009 |

(Continued)

OTHER PUBLICATIONS

Myny, K., "How to efficiently drive microLED displays" IMEC Aug. 1, 2022. (Year: 2022).*

(Continued)

*Primary Examiner* — J. E. Schoenholtz
(74) *Attorney, Agent, or Firm* — Sughrue Mion, PLLC

(57) ABSTRACT

A light-emitting device includes a backplane, light-emitting diodes (LEDs) located over a front side of the backplane, and microlenses respectively disposed over the LEDs. Each microlens includes a back surface having a first surface area and configured to receive light emitted from a corresponding LED, an opposing front surface having a second surface area and configured to emit the received light, and at least one (Continued)

sidewall extending from the front surface to the back surface. The second surface area is greater than the first surface area.

17 Claims, 15 Drawing Sheets

(56) References Cited

U.S. PATENT DOCUMENTS

| | | | |
|---|---|---|---|
| 11,854,810 B1* | 12/2023 | Lutgen | H01L 33/0062 |
| 2017/0038028 A1 | 2/2017 | Cho et al. | |
| 2018/0175262 A1 | 6/2018 | Jansen et al. | |
| 2020/0135977 A1* | 4/2020 | Leung | G02B 19/0028 |
| 2020/0357968 A1* | 11/2020 | Lutgen | H01L 21/2007 |
| 2021/0013379 A1* | 1/2021 | Tischler | H01L 33/0095 |
| 2021/0088200 A1* | 3/2021 | Smith | F21V 7/0091 |
| 2021/0193889 A1 | 6/2021 | Kim | |
| 2021/0257510 A1 | 8/2021 | Chadda et al. | |
| 2024/0079537 A1* | 3/2024 | Son | H01L 25/0753 |
| 2024/0120446 A1* | 4/2024 | Leung | H01L 33/325 |

FOREIGN PATENT DOCUMENTS

| | | |
|---|---|---|
| KR | 10-2013-0126546 A | 11/2013 |
| KR | 10-2079938 A | 2/2020 |

OTHER PUBLICATIONS

Inkron Overview, 2016. (Year: 2016).*
Miao, Zhengyu. Modeling and Simulation of Surface Profile Forming Process of Microlenses and Their Application in Optical Interconnection Devices, Louisiana State University, 2013. (Year: 2013).*
Notification Concerning Transmittal of International Preliminary Report on Patentability and Written Opinion of the International Searching Authority for International Patent Application No. PCT/US2021/063519, mailed Jul. 20, 2023, 7 pages.
Notification of Transmittal of the International Search Report and The Written Opinion of the International Searching Authority for International Patent Application No. PCT/US2021/063519, mailed Apr. 7, 2022, 10 pages.

* cited by examiner

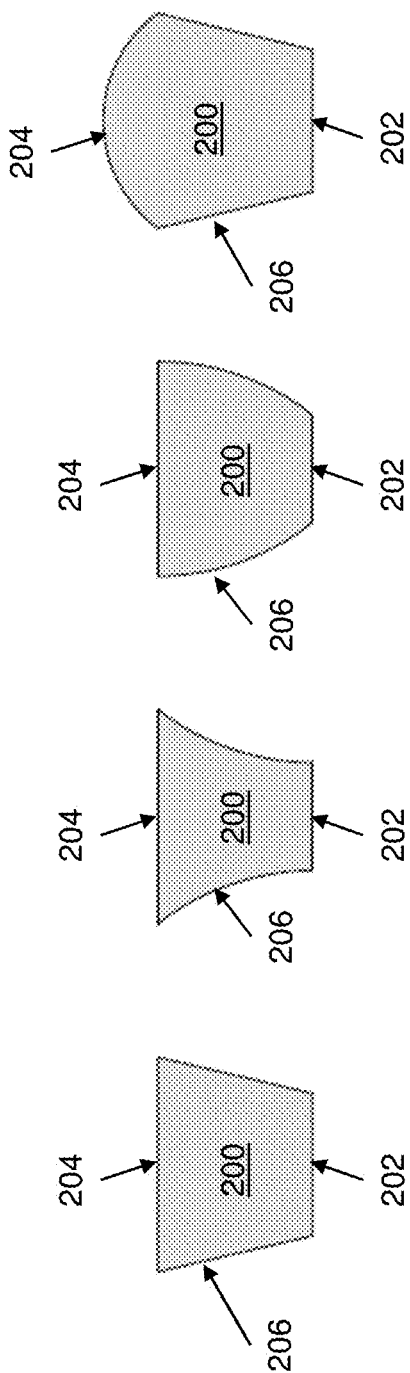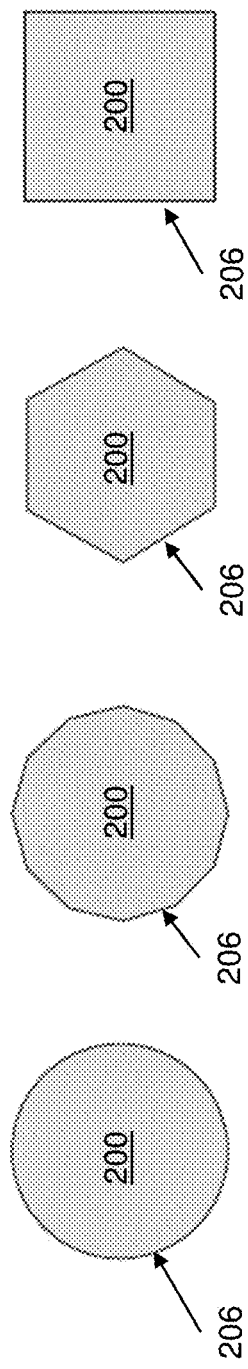

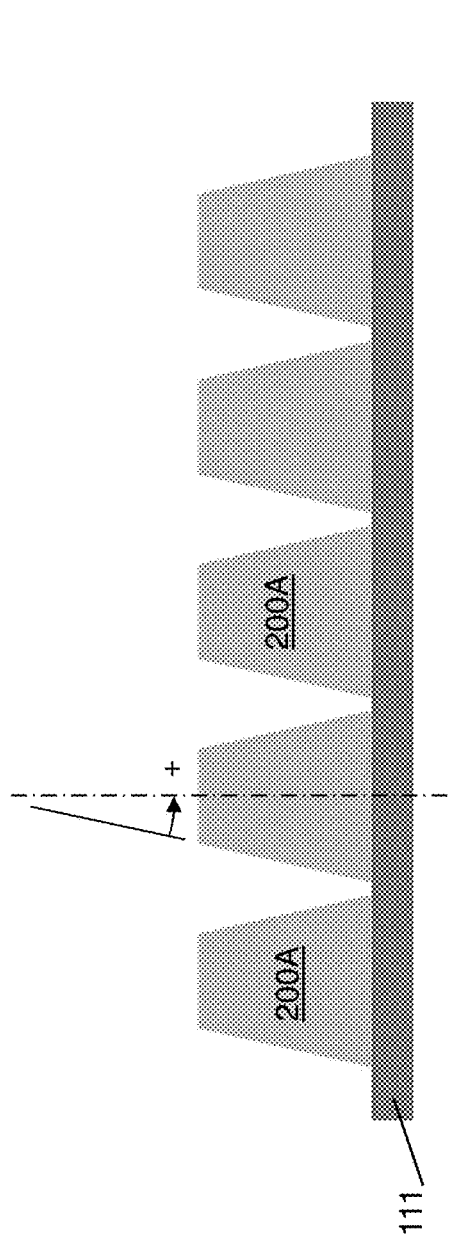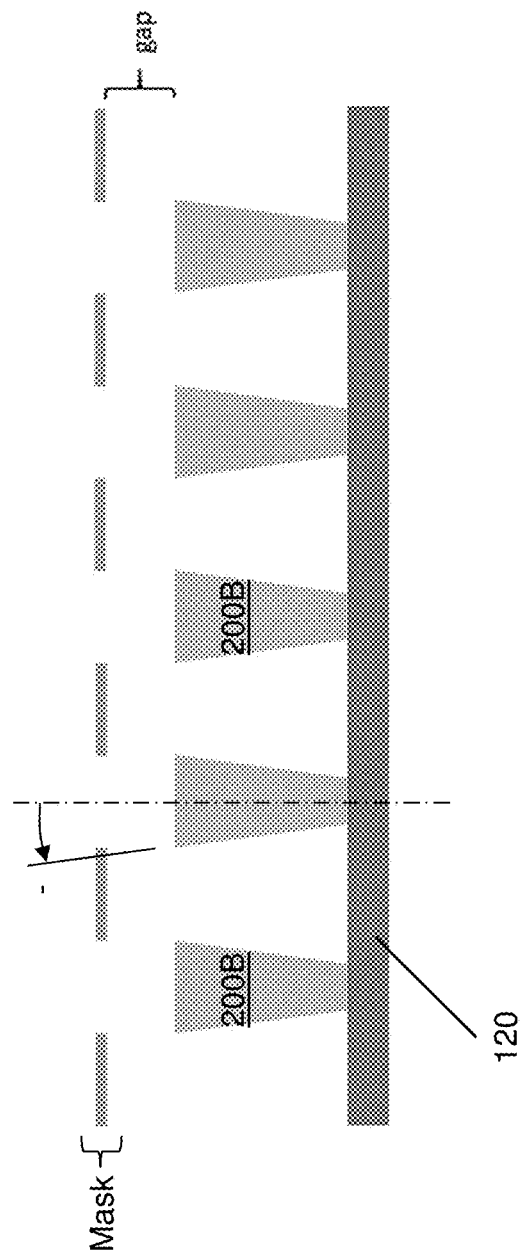

LIGHT-EMITTING DIODE DEVICE CONTAINING MICROLENSES AND METHOD OF MAKING THE SAME

FIELD

The embodiments of the present disclosure are directed to light-emitting devices in general, and to light-emitting diode devices including microlenses in particular.

BACKGROUND

Light-emitting devices such as light-emitting diodes (LEDs) are used in electronic displays, such as backlights in liquid crystal displays located in laptops or televisions, and LED billboards and microdisplays. Light-emitting devices include light-emitting diodes (LEDs) and various other types of electronic devices configured to emit light.

SUMMARY

According to an aspect of the present disclosure, a light-emitting device includes: a backplane; light-emitting diodes (LEDs) located over a front side of the backplane; and microlenses respectively disposed over the LEDs. Each microlens includes: a back surface having a first surface area and configured to receive light emitted from a corresponding LED; an opposing front surface having a second surface area and configured to emit the received light; and at least one sidewall extending from the front surface to the back surface. The second surface area is greater than the first surface area.

BRIEF DESCRIPTION OF THE DRAWINGS

FIGS. 7A-7D are vertical cross-sectional views showing different vertical geometries that may be utilized by microlens 200, according to various embodiments of the present disclosure.

FIGS. 8A-8D are horizontal cross-sectional views showing different horizontal geometries that may be utilized by the microlens 200, according to various embodiments of the present disclosure.

FIG. 11A and FIG. 11B show a step in a photolithographic process for forming an array of microlenses according to various embodiments of the present disclosure.

DETAILED DESCRIPTION

Figure 1A:
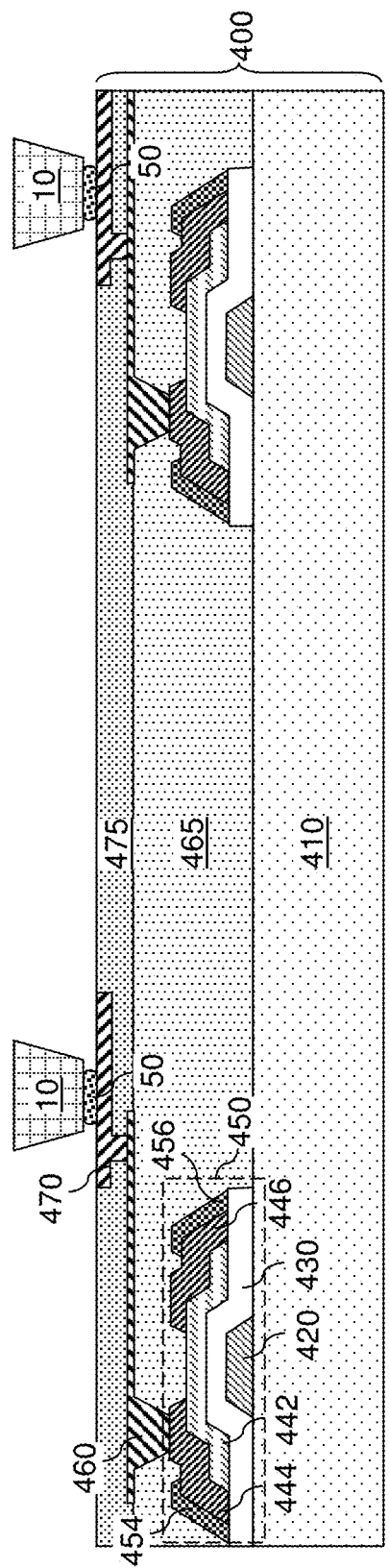
FIG. 1A is a vertical cross-sectional view of a first exemplary structure after forming an array of light-emitting diodes on a backplane according to a first embodiment of the present disclosure.

As discussed above, the present disclosure is directed to light-emitting diode arrays containing a microlens array. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "layer" refers to a continuous portion of at least one material including a region having a thickness. A layer may consist of a single material portion having a homogeneous composition, or may include multiple material portions having different compositions.

Ranges can be expressed herein as from "about" one particular value, and/or to "about" another particular value. When such a range is expressed, examples include from the one particular value and/or to the other particular value. Similarly, when values are expressed as approximations, by use of the antecedent "about" or "substantially" it will be understood that the particular value forms another aspect. In some embodiments, a value of "about X" may include values of +/−1% X. It will be further understood that the endpoints of each of the ranges are significant both in relation to the other endpoint, and independently of the other endpoint.

As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "semiconducting material" refers to a material having electrical conductivity in the range from $1.0 \times 10^{-6}$ S/cm to $1.0 \times 10^5$ S/cm. As used herein, a "metallic material" refers to a conductive material including at least one metallic element therein. All measurements for electrical conductivities are made at the standard condition.

A display device, such as a direct view display can be formed from an ordered array of pixels. Each pixel can include a set of subpixels that emit light at a respective peak wavelength. For example, a pixel can include a red subpixel, a green subpixel, and a blue subpixel. Each subpixel can include one or more light-emitting diodes that emit light of a particular wavelength. Each pixel is driven by a backplane circuit such that any combination of colors within a color gamut may be shown on the display for each pixel. The display panel can be formed by a process in which LED subpixels are soldered to, or otherwise electrically attached to, a bond pad located on a backplane. The bond pad is electrically driven by the backplane circuit and other driving electronics.

In the embodiments of the present disclosure, a method for fabrication of a multicolor (e.g., three or more color) direct view display may be performed by using light-emitting devices which emit different color light in each pixel. In one embodiment, nanostructure (e.g., nanowire) or bulk (e.g., planar) LEDs may be used. Each LED may have a respective blue, green, or red light-emitting active region to form blue, green and red subpixels in each pixel. In another embodiment, a down converting element (e.g., red emitting phosphor, dye or quantum dots) can be formed over a blue or green light-emitting LED to form a red emitting subpixel. In another embodiment, a blue or green light-emitting nanowire LED in each subpixel is paired with a red emitting planar LED, such as an organic or inorganic red emitting planar LED to form a red emitting subpixel.

Figure 1B:
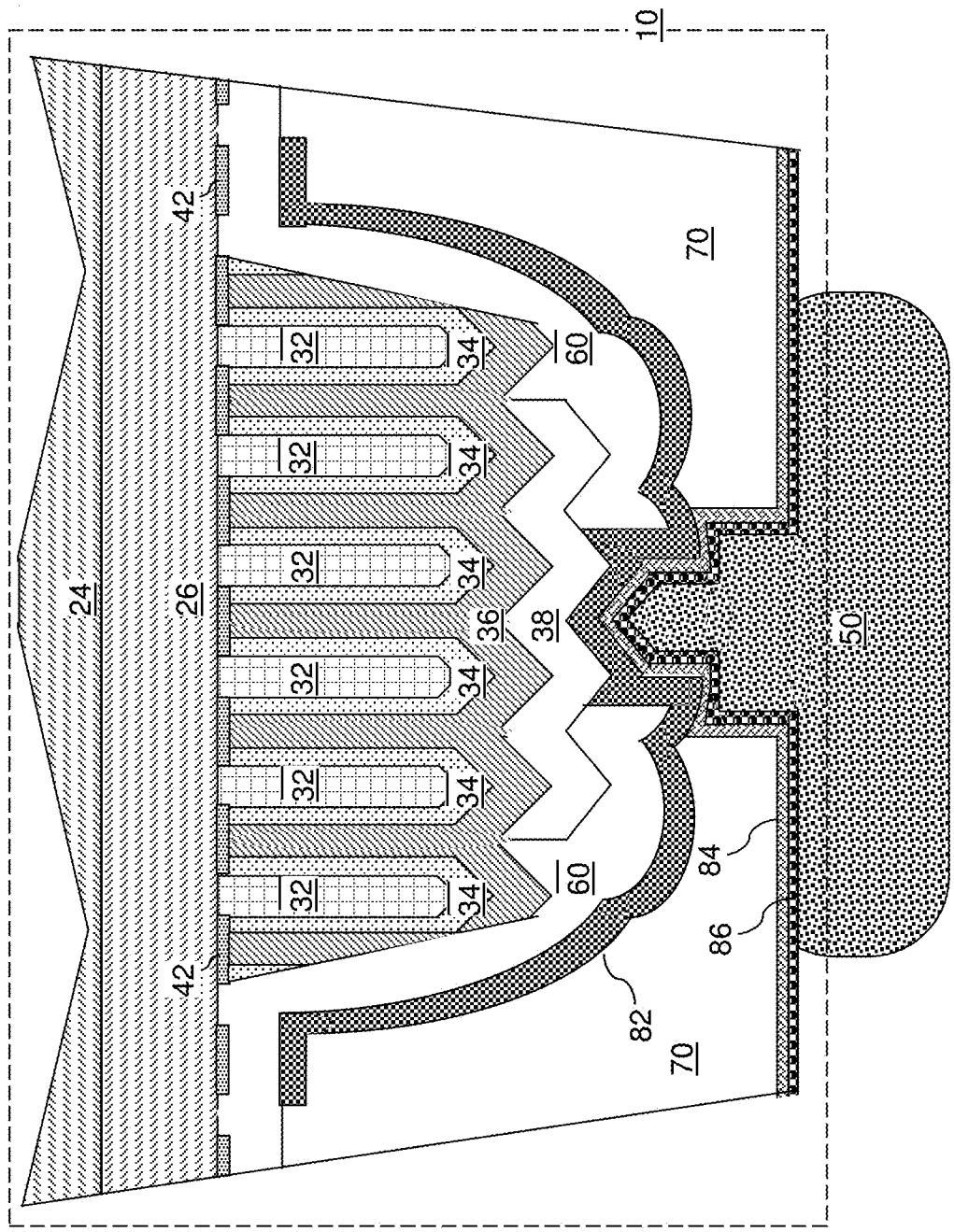
FIG. 1B is a magnified view of a region including a light-emitting device within the structure of FIG. 1A.

Referring to FIGS. 1A and 1B, a first exemplary structure according to a first embodiment of the present disclosure includes a backplane 400 and an array of light-emitting diodes 10 attached to a front side of the backplane 400 through an array of solder contacts, such as solder layer or solder balls 50. The backplane 400 includes a backplane substrate 410, which can be an insulating substrate. A control circuitry for controlling operation of the light-emitting devices 10 attached to the backplane 400 may be provided within the backplane. For example, switching devices 450 can be provided within the backplane 400. In an illustrative example, the switching devices 450 can include field effect transistors, such as thin film transistors (TFTs). In this case, each field effect transistor 450 may include a gate electrode 420, a gate dielectric 430, a channel region 442, a source region 446, and a drain region 444. While an inverted staggered TFT 450 is shown in FIG. 1A, other types of TFTs, such as inverted coplanar, top gated staggered and top gated coplanar TFTs can be used instead. Various electrical wirings can be provided to interconnect the various electrical nodes of the field effect transistors to electrical interfaces (not expressly shown) on the backplane 400. Source interconnect wiring 456 and drain interconnect wiring 454 are illustrated. Additional interconnect wiring may be provided as needed. The switching devices 450 can be encapsulated by an encapsulation dielectric layer 465. First-level metal interconnect structures 460 can be formed through the encapsulation dielectric layer 465 to a node of a respective switching device 450 such as a drain region 444. An interconnect level dielectric layer 475 may be formed over the encapsulation dielectric layer 465, and second-level metal interconnect structures 470 can be formed through the interconnect level dielectric layer 475 on the first-level metal interconnect structures 460. The second-level metal interconnect structures 470 can include an array of bonding pads for attaching the array of light-emitting diodes 10.

Each light-emitting diode 10 can be any diode configured to emit light along a direction away from the backplane 400 and having at least one bonding pad facing the backplane 400. While an exemplary configuration of the nanowire based light-emitting diodes 10 is illustrated in FIG. 1B, it is understood that other configurations for the light-emitting diodes 10 can also be employed, such as for example planar LEDs or LEDs formed in semiconductor mesas. A light-emitting diode 10 may be formed by sequentially depositing a buffer layer 24 and a doped compound semiconductor layer 26 (such as an n-doped GaN layer) having a doping of a first conductivity type on a transparent single crystalline substrate such as a sapphire substrate. A growth mask layer 42 with arrays of openings can be formed on top of the doped compound semiconductor layer 26. An array of nanowire cores 32 can be grown through the openings in the growth mask layer 42 by a selective epitaxial deposition process. Alternatively, nanopyramids may be grown in lieu of the nanowire cores 32. Methods for growing the nanowires cores 32 through the openings in the patterned growth mask layer 42 with substantially vertical sidewalls and faceted tip portion are described, for example, in U.S. Pat. No. 8,664,636 to Konsek et al., U.S. Pat. No. 8,669,574 to Konsek et al., U.S. Pat. No. 9,287,443 to Konsek et al., and U.S. Pat. No. 9,281,442 to Romano et al., each of which is assigned to Glo AB and U.S. Pat. No. 8,309,439 to Seifert et al., which is assigned to QuNano AB, all of which are incorporated herein by reference in their entirety.

An active shell 34 is formed on each nanowires core 32. The active shell 34 includes at least one semiconductor material that emits light upon application of a suitable electrical bias. For example, each active shell 34 can include a single or a multi-quantum well (MQW) structure that emits light upon application of an electrical bias thereacross. For example, the quantum well(s) may comprise indium gallium nitride well(s) located between gallium nitride or aluminum gallium nitride barrier layers. Alternatively, the active shell 34 can include any other suitable semiconductor layers or stack of layers for light-emitting diode applications provided that it can be grown on the surfaces of the nanowires cores 32. The set of all layers within an active shell 34 is herein referred to as an active layer. The active shell may emit any color light, such as blue, green or red light. Methods for growing the active shells 34 on the nanowires cores 32 are described, for example, in U.S. Pat. No. 8,664,636 to Konsek et al., U.S. Pat. No. 8,669,574 to Konsek et al., U.S. Pat. No. 9,287,443 to Konsek et al., and U.S. Pat. No. 9,281,442 to Romano et al., each of which is assigned to Glo AB and U.S. Pat. No. 8,309,439 to Seifert et al., which is assigned to QuNano AB, all of which are incorporated herein by reference in their entirety. In an alternative embodiment, planar layers (32, 34) may be formed instead of the nanowire cores 32 and active region shells 34.

A second conductivity type semiconductor material layer 36 is formed on the sidewalls and faceted outer surfaces of the cores and shells (32, 34). The second conductivity type semiconductor material layer 36 includes a doped semiconductor material having a doping of a second conductivity type, which is the opposite of the first conductivity type. For example, if the first conductivity type is n-type, then the second conductivity type is p-type. If the first conductivity type is p-type, then the second conductivity type is n-type.

The assembly of the second conductivity type semiconductor material layer 36 and the nanowire cores (32, 34) can be patterned to form discrete light-emitting areas. An optional transparent conductive layer 38, such as a transparent conductive oxide layer, can be deposited and patterned over the horizontally extending portion of the second conductivity type semiconductor material layer 36. An optional dielectric material layer 60 may be deposited over the transparent conductive oxide layer 38 and the second conductivity type semiconductor material layer 36. The dielectric material layer 60 includes a transparent dielectric material such as silicon oxide, silicon nitride, a dielectric metal oxide (such as aluminum oxide), organosilicate glass, or porous variants thereof. An opening can be formed through the dielectric material layer 60 in each region that overlies a respective cluster of nanowires (32, 34). A conductive reflector 82 can be formed over each cluster of nanowires (32, 34) and on a respective one of the transparent conducive oxide layers 38 or a respective one of the second conductivity type semiconductor material layers 36 by depositing a conductive reflector layer and patterning the conductive reflector layer (e.g., Al and/or Ag reflector layer(s)). An insulating cap layer 70 can be formed over the conductive reflectors 82. An opening can be formed through each area of the insulating cap layer 70 that overlies a respective conductive reflector 82, and bonding pad layers (84, 86) can be formed in the openings and over the insulating cap layer 70. The bonding pad layers (84, 86), the insulating cap layer 70, the dielectric material layer 60, the growth mask layer 42, the doped compound semiconductor layer 26, and the buffer layer 24 can be patterned to form trenches that isolate each cluster of nanowires (32, 34) from other clusters of nanowires (32, 34).

Each laterally isolated portion of the structure overlying the transparent single crystalline substrate constitutes a light-emitting diode 10. Solder balls 50 can be attached to each device-side bonding pad, which is a patterned portion of the bonding pad layers (84, 86). The assembly of the transparent single crystalline substrate and an array of light-emitting diodes attached thereto is flipped upside down, and is disposed over the backplane 400. Each solder ball 50 on a light-emitting diode 10 that needs to be attached to the backplane 400 can be reflowed so that an overlying light-emitting diode 10 is bonded to the backplane. The reflow may be conducted by heating the solder balls by irradiating by an infrared laser beam through the backplane 400 or through the LEDs 10 onto the solder balls 50 or by annealing the device in a furnace or similar heating apparatus above the solder ball 50 melting temperature. Solder balls 50 that underlie light-emitting diodes that need not be transferred are not irradiated by the infrared laser beam or have a composition with a higher melting point than the furnace anneal temperature.

Portions of the buffer layer 24 that overlie attached light-emitting diodes 10 are sequentially irradiated by a high power laser beam, such as an ultraviolet or visible light laser beam, through the transparent single crystalline substrate. Thus, each light-emitting diode 10 that is soldered to the backplane 400 can be detached from the transparent single crystalline substrate by laser irradiation. The first exemplary structure of FIGS. 1A and 1B can be thus provided.

Figure 2A:
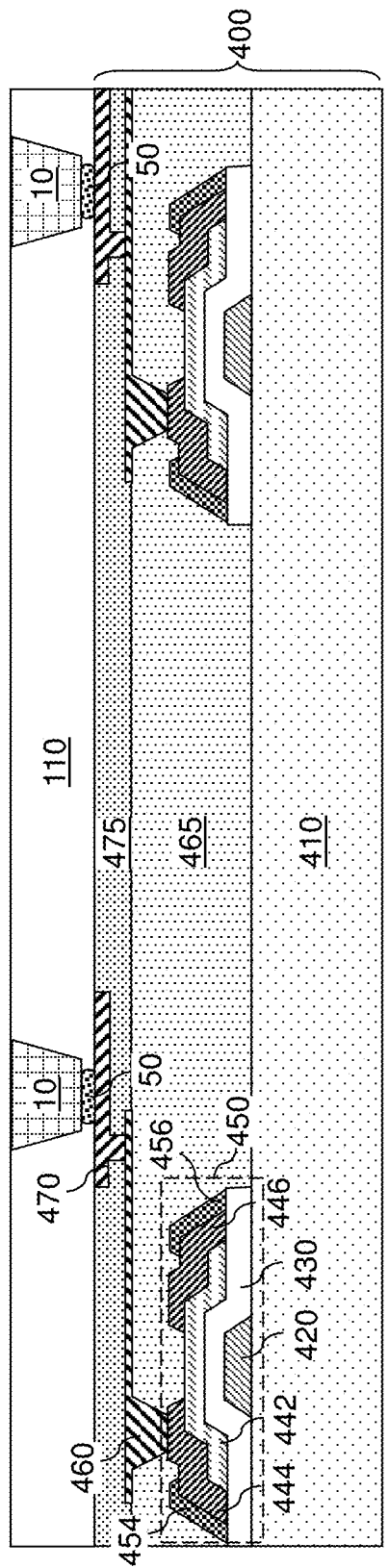
FIG. 2A is a vertical cross-sectional view of the first exemplary structure after depositing and planarizing a dielectric matrix layer according to the first embodiment of the present disclosure.
Figure 2B:
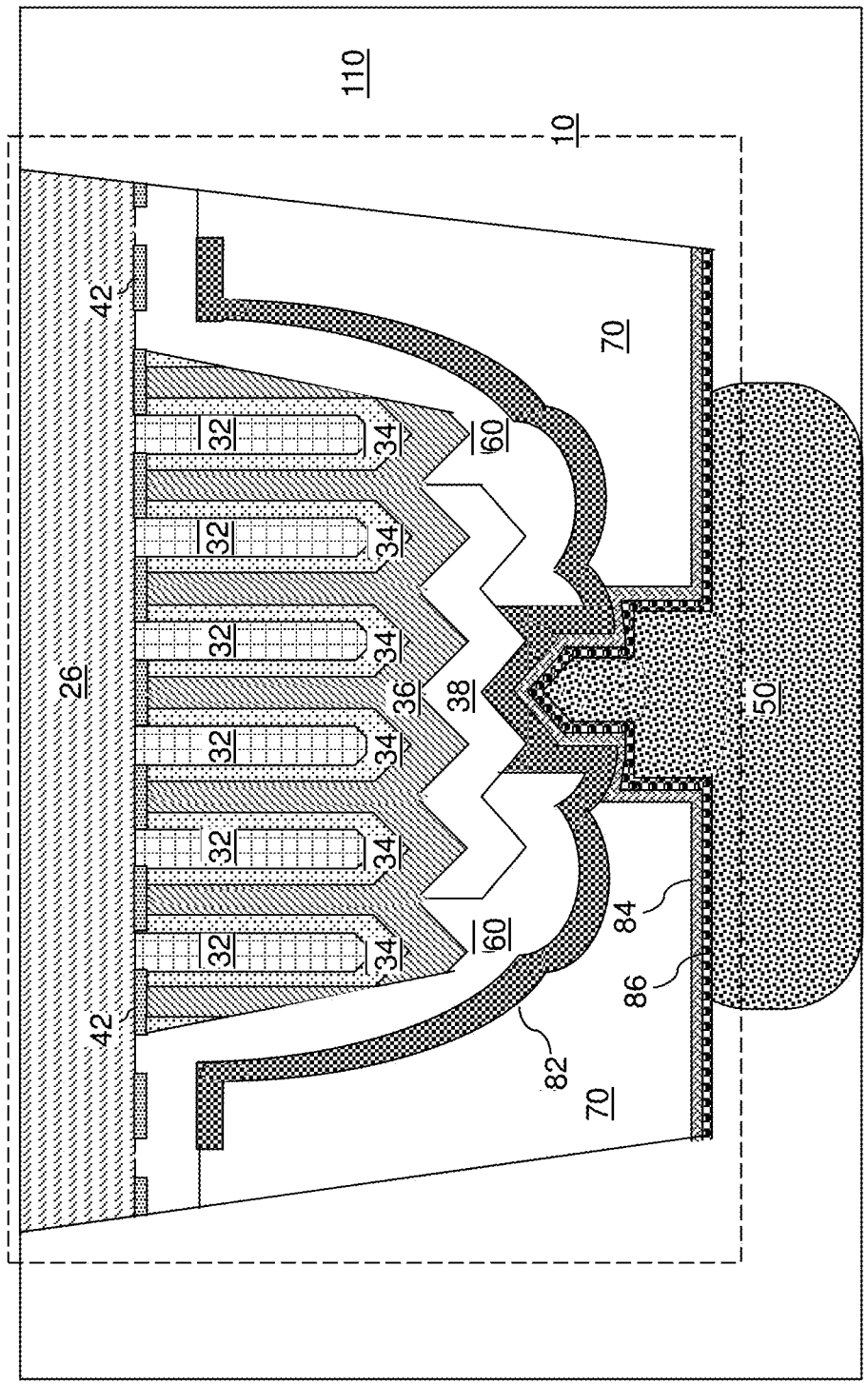
FIG. 2B is a magnified view of a region including a light-emitting device within the structure of FIG. 2A.

Referring to FIGS. 2A and 2B, a planarizable dielectric material layer is deposited over the backplane 400 between the array of light-emitting diodes 10. The planarizable dielectric material layer can be a silicon oxide-based material such as undoped silicate glass, a doped silicate glass (such as borosilicate glass, phosphosilicate glass, or borophosphosilicate glass), or a flowable oxide (FOX)), silicone, or an organic material such as resin. The planarizable dielectric material can be deposited by spin coating or chemical vapor deposition (such as sub-atmospheric chemical vapor deposition or plasma enhanced chemical vapor deposition).

The planarizable dielectric material is either self-planarized if deposited by spin coating or can be subsequently planarized, for example, by chemical mechanical planarization (CMP). If any portion of the buffer layer 24 is present in the light-emitting diodes, the remaining portions of the buffer layer 24 can be removed during the planarization process so that top surfaces of the doped compound semiconductor layer 26 are physically exposed after the planarization process. The remaining continuous portion of the planarizable dielectric material layer is herein referred to as a dielectric matrix layer 110. The dielectric matrix layer 110 embeds the array of light-emitting diodes 10. The top surface of the dielectric matrix layer 110 can be coplanar with the top surfaces of the light-emitting diodes 10. The dielectric matrix layer 110 is located on the front side of the backplane 400, and laterally surrounds the array of light-emitting diodes 10.

Figure 3A:
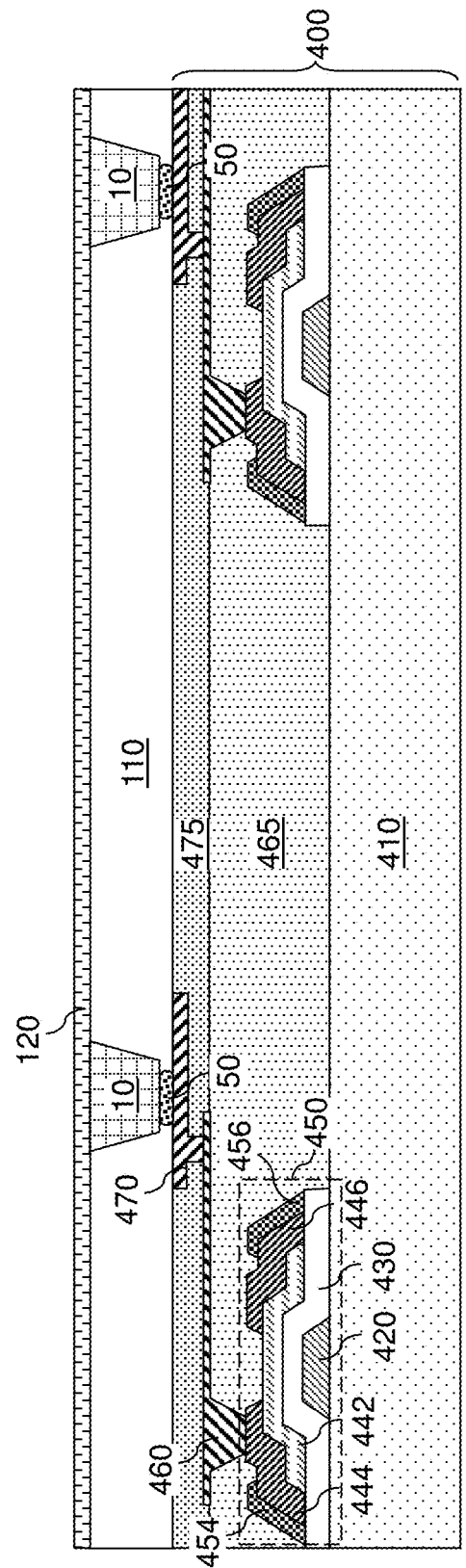
FIG. 3A is a vertical cross-sectional view of the first exemplary structure after formation of a transparent conductive layer according to the first embodiment of the present disclosure.
Figure 3B:
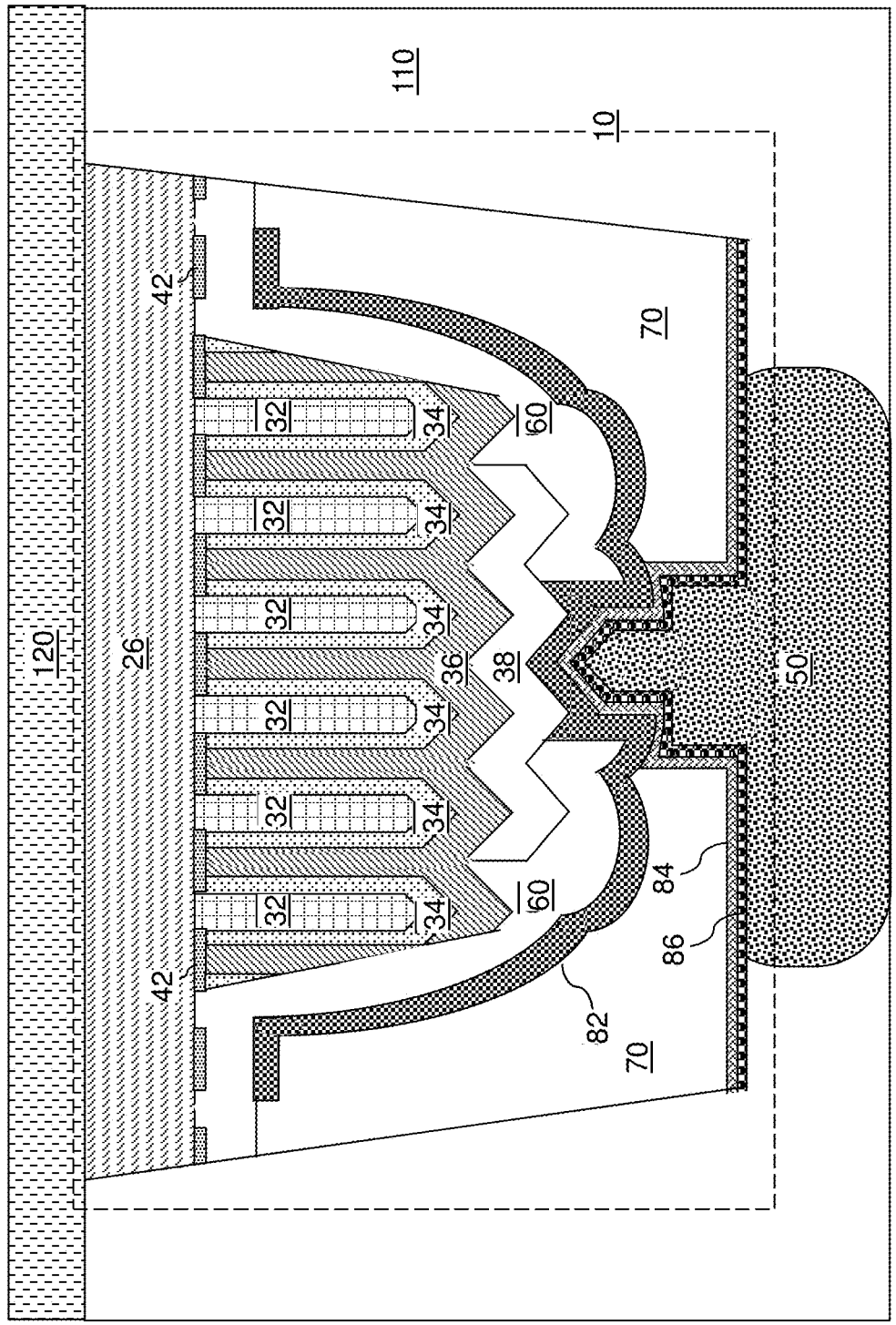
FIG. 3B is a magnified view of a region including a light-emitting device within the structure of FIG. 3A.

Referring to FIGS. 3A and 3B, a transparent conductive layer 120 can be formed directly on the top surfaces, i.e., the front surfaces, of the light-emitting diodes 10. The transparent conductive layer 120 can include a transparent conductive material such as indium tin oxide or aluminum doped zinc oxide. The transparent conductive layer 120 can be deposited as a continuous material layer that extends across the entire area of the array of light-emitting diodes 10. The thickness of the transparent conductive layer 120 can be in a range from 20 nm to 600 nm, such as from 100 nm to 300 nm, although lesser and greater thicknesses can also be employed. The transparent conductive layer 120 can function as a common electrode (such as a cathode) of the array of light-emitting diodes 10. The transparent conductive layer 120 forms a part of a bus electrode for the device.

Figure 4A:
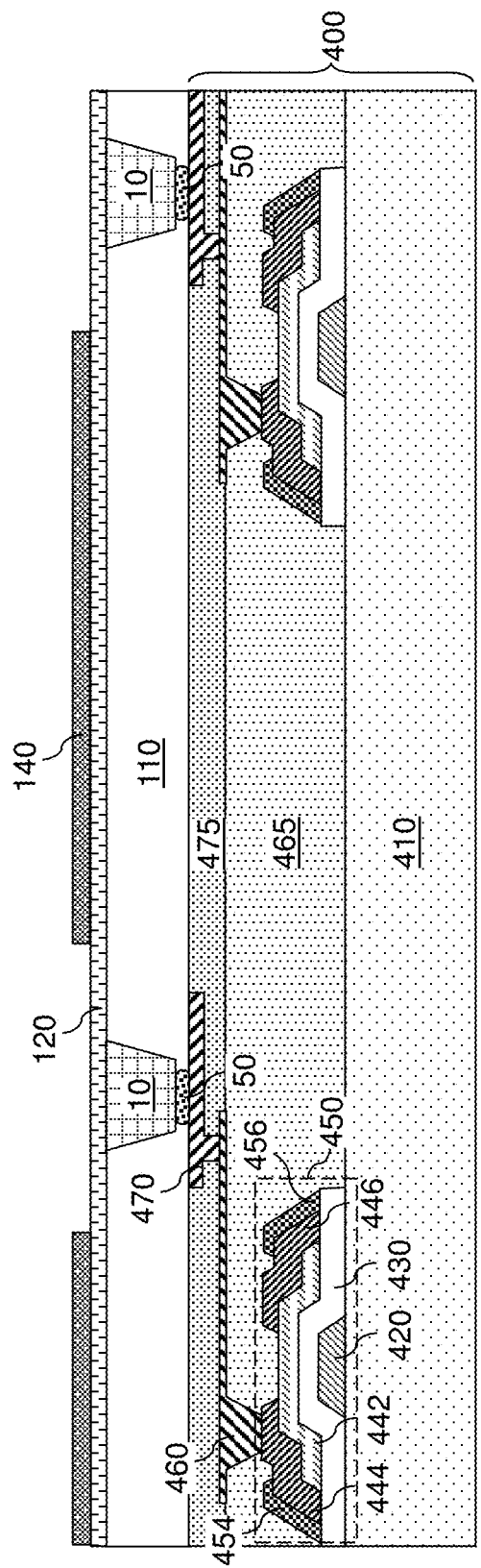
FIG. 4A is a vertical cross-sectional view of the first exemplary structure after formation of a patterned light-absorptive conductive layer as a patterned bus electrode layer according to the first embodiment of the present disclosure.
Figure 4B:
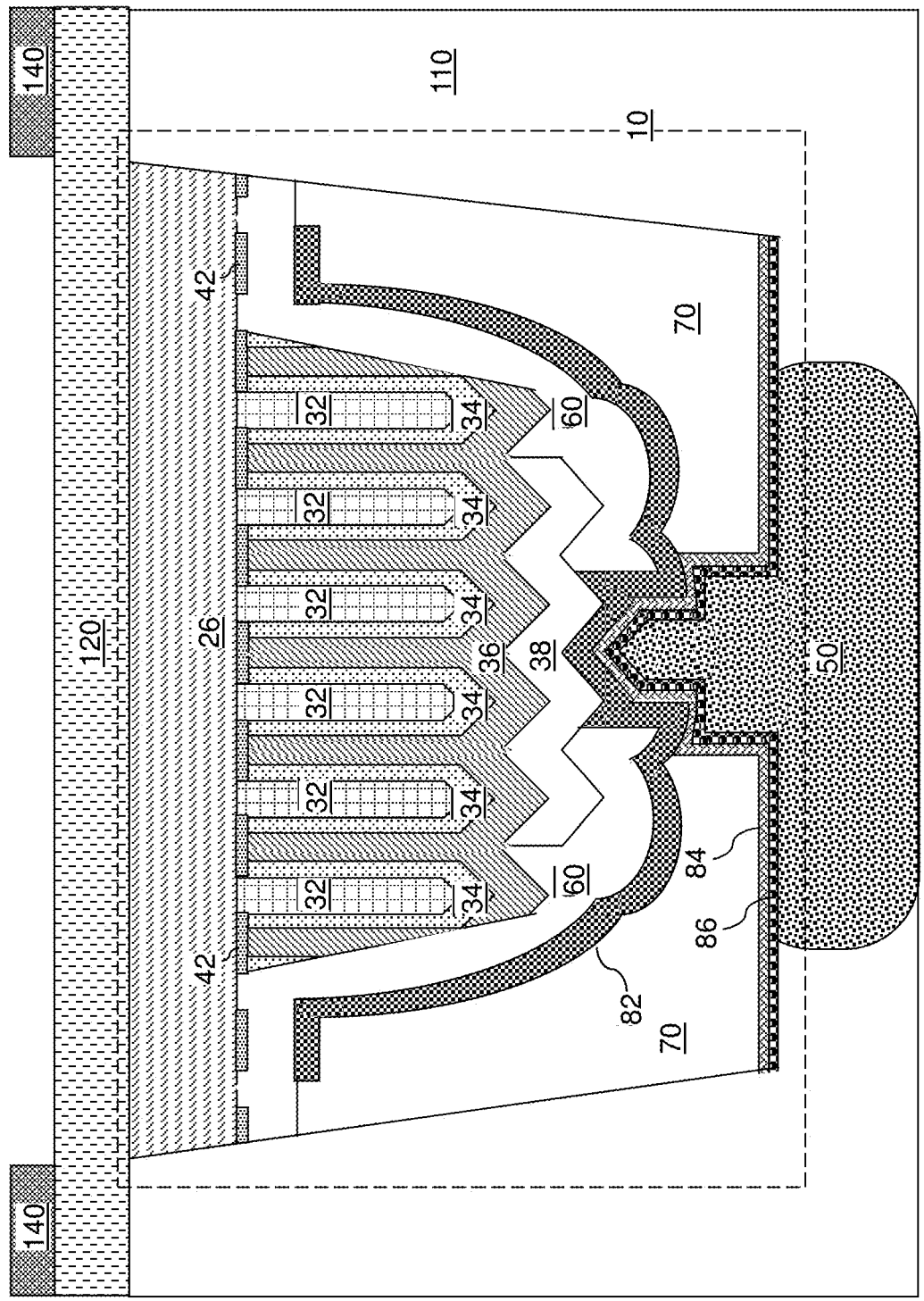
FIG. 4B is a magnified view of a region including a light-emitting device within the structure of FIG. 4A.

Referring to FIGS. 4A and 4B, a black matrix 140 is formed over the top surface of the transparent conductive layer 120 by deposition and patterning of at least one material layer. The black matrix 140 has a higher absorptivity than the transparent conductive layer 120. As used herein, a "black matrix" may be a light-absorptive conductive layer that includes at least one conductive material and that absorbs more than 90% of visible light (i.e., radiation having a wavelength between 400 nm and 800 nm). As used herein, light absorption or light reflection is measured by a percentage of an incident light energy that is absorbed or reflected for the wavelength range from 400 nm to 800 nm, i.e., only within the visible spectrum. Each of the at least one conductive material has electrical conductivity greater than $1.0 \times 10^5$ S/cm. The black matrix 140 may include a single material layer providing electrical conductivity greater than $1.0 \times 10^5$ S/cm and providing absorption of more than 90%, and/or more than 95%, of visible light, or may include multiple material layers such that one or more of the material layers provide electrical conductivity greater than $1.0 \times 10^5$ S/cm, and one or more different material layers provide absorption of more than 90%, and/or more than 95%, of visible light. The light-absorptive conductive layer 140 is more electrically conductive than the transparent conductive layer 120. For example, the black matrix 140 has an electrical conductivity that is at least 25% higher, such as 50% to 300% than that of the transparent conductive layer 120.

For example, the at least one material layer can be deposited over the transparent conductive layer 120, and a photoresist layer can be applied over the at least one material layer. The photoresist layer can be lithographically patterned by lithographic exposure and development, and an etch process can be performed to etch the materials of the at least one material layer employing the patterned photoresist layer as an etch mask. The etch chemistry can be selected to etch the material(s) of the at least one material layer of the light-absorptive conductive layer 140. If the at least one material layer comprises multiple material layers, the multiple material layers may be sequentially etched employing a series of different etch chemistries. The etch process can form an array of openings through the at least one material layer. The patterned black matrix 140 is a patterned bus electrode layer, which forms part of the bus electrode that functions as a common electrode for each light-emitting diode 10 within the array of light-emitting diodes 10. The photoresist layer can be subsequently removed, for example, by ashing. The bus electrode comprises a combination of the light-absorptive conductive layer 140 and the transparent conductive layer 120.

FIGS. 5A-5D illustrate first through fourth layouts for the array of light-emitting diodes 10 and the black matrix 140, i.e., the patterned bus electrode layer. The black matrix 140 is electrically shorted to the transparent conductive layer 120 and includes an array of openings therein. Each light-emitting diode 10 within the array of light-emitting diodes 10 can be located within an area of a respective opening through the black matrix 140. In one embodiment, a periphery of each opening within the black matrix 140 can be laterally offset outward from a periphery of a respective light-emitting diode 10 that is laterally enclosed therein.

Generally, the black matrix 140 of embodiments of the present disclosure can reduce reflectance from incoming ambient light to increase the contrast ratio and compensate for the higher resistance of the transparent conductive layer 120 which reduces or prevents an IR drop. The shapes of openings in the black matrix 140 can be selected to expose only a single light-emitting diode 10 (as in the configurations of FIGS. 5A and 5C), or to expose a row of light-emitting diodes 10 (as in the configuration of FIGS. 5B and 5D). Alternatively, the shapes of openings in the black matrix can be selected to expose a group of light-emitting diodes 10 that constitutes a single pixel, which can include a set of subpixels emitting light at different peak wavelengths. The black matrix 140 comprises at least one conductive material layer and provides a higher light absorption than top surfaces of the light-emitting diodes 10.

Figure 5B:
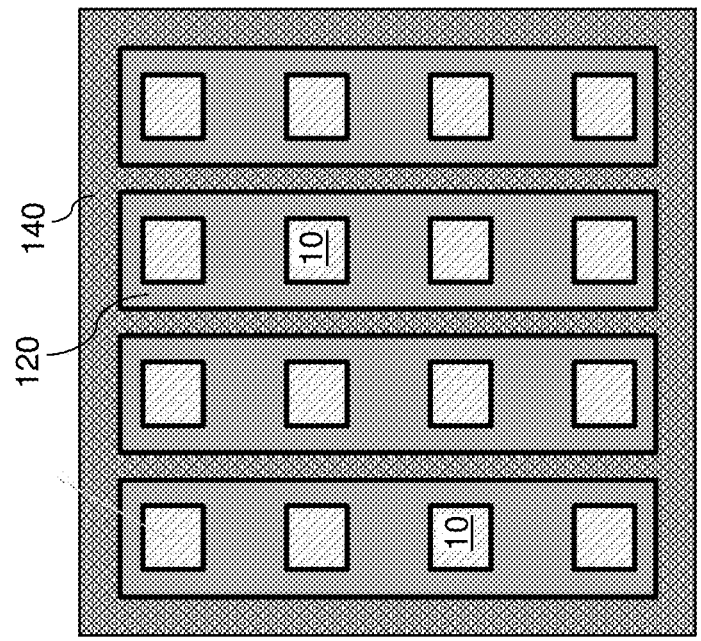
FIG. 5B is a plan view of a second layout for the first exemplary structure according to the first embodiment of the present disclosure.
Figure 5A:
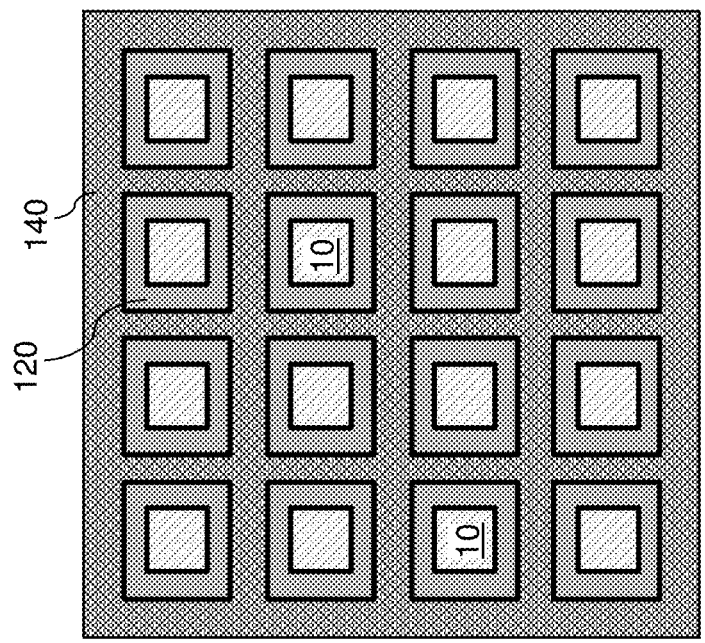
FIG. 5A is a plan view of a first layout for the first exemplary structure according to the first embodiment of the present disclosure.
Figure 5D:
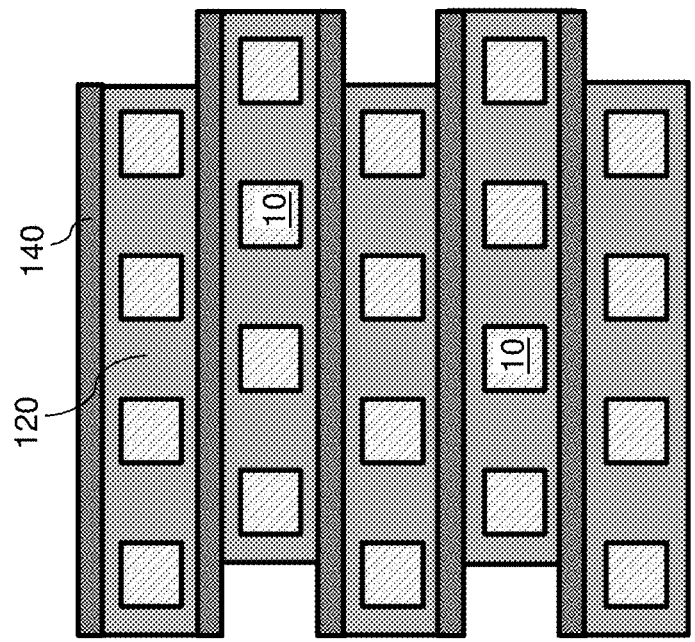
FIG. 5D is a plan view of a fourth layout for the first exemplary structure according to the first embodiment of the present disclosure.
Figure 5C:
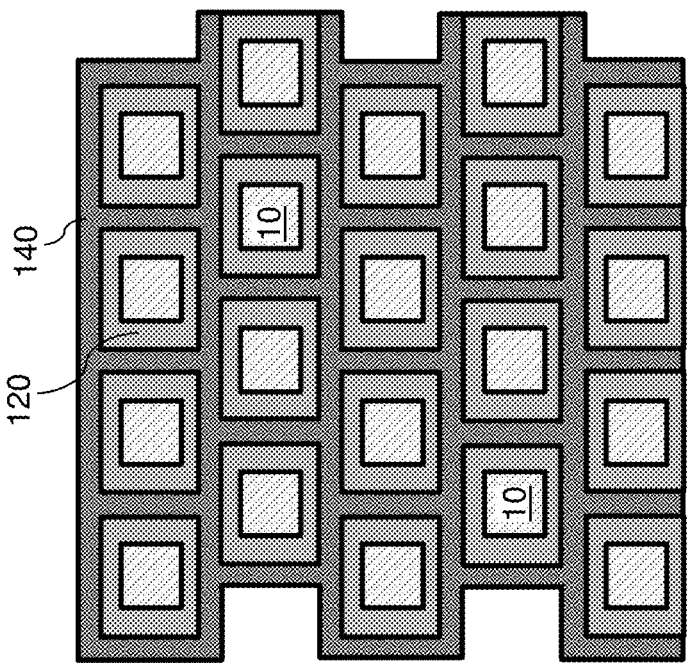
FIG. 5C is a plan view of a third layout for the first exemplary structure according to the first embodiment of the present disclosure.

The LEDs 10 may be arranged in a rectangular grid of rows and columns as shown in FIGS. 5A and 5B, or the LEDs 10 may have a staggered configuration in which the LEDs are arranged in row or column direction but are offset from each other in the other one of the column or row direction, as shown in FIGS. 5C and 5D.

Various layer stacks may be employed for the at least one material layer that constitutes the black matrix 140. For example, in some embodiments, the black matrix 140 may be formed of multiple layers, such as a metal layer, a buffer layer, phase matching layer, and/or a metallic light-absorptive layer including a conductive metallic material having a higher light absorption of the visible light than the metal layer.

Figure 6A:
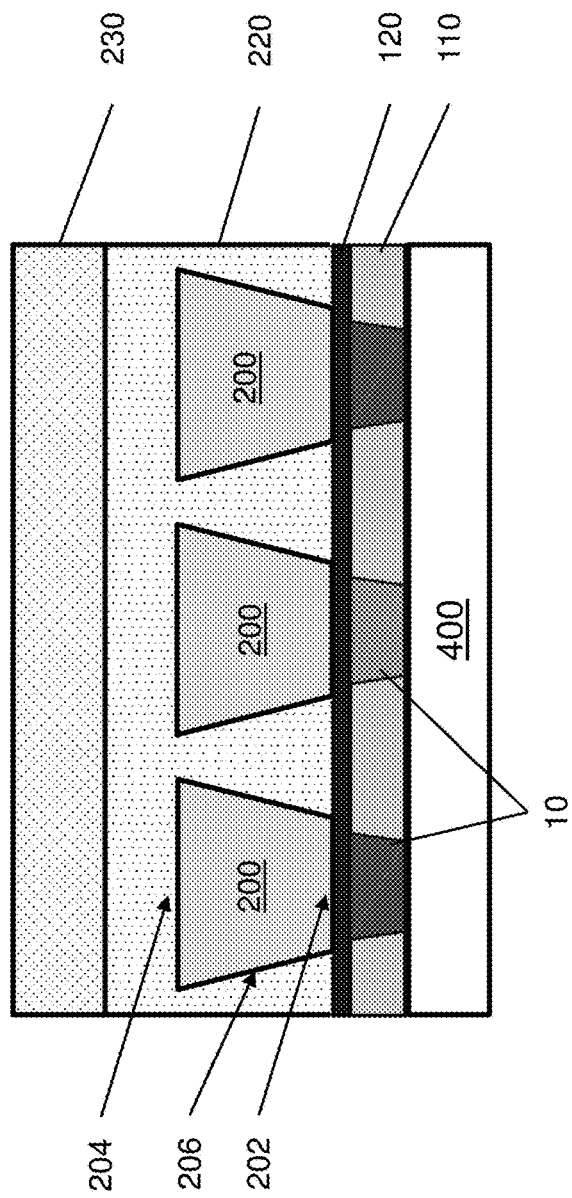
FIG. 6A is a vertical sectional view of a portion of a light-emitting display device, according to various embodiments of the present disclosure.
Figure 6B:
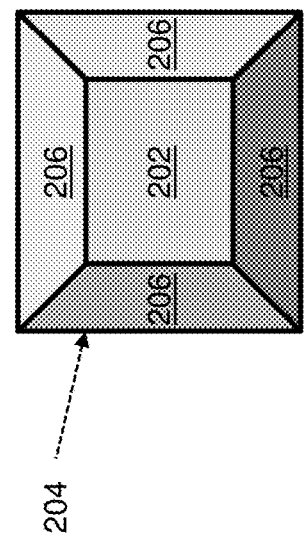
FIG. 6B is a bottom view of a microlens of FIG. 6A.

FIG. 6A is a vertical sectional view of a portion of a light-emitting display device, according to various embodiments of the present disclosure. FIG. 6B is a bottom view of a microlens 200 of FIG. 6A. Referring to FIGS. 6A and 6B, the display device may include an array of LEDs 10 arranged on a backplane 400. The display device may be a direct-view display device, in some embodiments. The LEDs 10 may be arranged in a rectangular grid of rows and columns as shown in FIGS. 5A and 5B, or the LEDs 10 may have a staggered configuration in which the LEDs are arranged in row or column direction but are offset from each other in the other one of the column or row direction, as shown in FIGS. 5C and 5D. The LEDs may include red, green, and blue light emitting LEDs. The LEDs 10 may comprise any type of LEDs (e.g., inorganic or organic; nanowire type or bulk/planar type).

The LEDs 10 may be disposed within a dielectric matrix layer 110 which is coplanar with the top surface of the LEDs 10. A transparent conductive layer 120 may be disposed on the LEDs 10 and the dielectric matrix layer 110. The above described black matrix 140 is optional and may be present or omitted. An array of the microlenses 200 may be disposed over the transparent conductive layer 120, with each microlens 200 being disposed over a corresponding LED 10. Accordingly, the microlenses 200 may be arranged in a rectangular grid of rows and columns, or the microlenses 200 may have a staggered configuration in which the microlenses 200 are arranged in row or column direction but are offset from each other in the other one of the column or row direction.

The microlenses 200 may be formed of an optically transparent material. The material may comprise a polymer material, such as a photoimagable (i.e., photosensitive) or a non-photoimagable polymer material. For example, the refractive index value of the microlenses 200 may be greater than 1 and less than or equal to the refractive index value of the LED 10. For example, the microlenses 200 may have a refractive index value of greater than 1 and less than or equal to 2.4, when the LEDs 10 include an emission surface formed of GaN having a refractive index value of about 2.4. The microlens curvature may be varied based on the refractive index of the microlens material.

The microlenses 200 may be embedded in an optional low refractive index (RI) layer 220. The low RI layer 220 may be formed of a material having a refractive index value n ranging from about 1.05 to about 1.3, such as from about 1.1 to about 1.2. For example, the low RI layer 220 may be formed of a polymer such as ILE-500 series high RI encapsulants available from Inkron Co. A cover glass 230 may be optionally disposed on the low RI layer 220. The cover glass 230 may be formed of any suitable glass material and may include touch screen-type functionality.

Each microlens 200 may each include a back surface 202, an opposing front surface 204, and one or more side walls 206 that extend from the back surface 202 to the front surface 204. The back surface 202 faces the respective LED 10, while the front surface 204 faces away from the respective LED 10 and is located farther from the respective LED 10 than the back surface 202. The surface area of the front surface 204 may be greater than the surface area of the back surface 202. For example, the surface area of the front surface 204 may be at least 10% greater, from about 10% to about 300%, such as from about 20% to about 200%, or from about 25% to about 100%, greater than the surface area of the back surface 202. In some embodiments, the area of the back surface 202 may be greater than the area of an emission surface of a corresponding LED 10. In one embodiment, the microlenses 200 may be wider on top than on the bottom, such as have an inverted truncated pyramid shape.

The microlenses 200 may be positioned such that the back surface 202 of each microlens 200 receives light emitted from an underlying LED 10. The received light may be emitted from the front surface 204 of each microlens 200. Preferably, only one of the microlenses 200 is disposed over each one of the respective LEDs 10. The back surface 202 and the front surface 204 may be planar or curved. In some embodiments, the front surface 204 may be convex.

FIGS. 7A-7D are vertical cross-sectional views showing different vertical geometries that may be utilized by microlens 200, according to various embodiments of the present disclosure. Referring to FIG. 7A, the microlens 200 may have a trapezoidal vertical cross-sectional shape, and the back surface 202, front surface 204, and the sidewall(s)s 206 of the microlens 200 may be linear in cross-section.

Referring to FIG. 7B, the back surface 202 and front surface 204 may be linear in cross-section, and the sidewall(s)s 206 may be concave in cross-section. Referring to FIG. 7C, the back surface 202 and front surface 204 may be linear in cross-section, and the sidewall(s)s 206 may be convex in cross-section. Referring to FIG. 7D, the back surface 202 and sidewall(s) 206 may be linear in cross-section, and the front surface 204 may be convex in cross-section. However, the microlens 200 is not limited to any particular cross-sectional geometry, so long as the front surface 204 has a larger area than the back surface 202.

FIGS. 8A-8D are horizontal cross-sectional views showing different horizontal geometries that may be utilized by the microlens 200, according to various embodiments of the present disclosure. The horizontal cross-section may be taken in a plan parallel to the back surface of each microlens 200. Referring to FIG. 8A, the microlens 200 may have a circular horizontal cross-section. Referring to FIGS. 8B-8D, the microlens 200 may be polygonal in horizontal cross-section. For example, the microlens 200 may be rectangular, hexagonal, dodecagonal, or the like, in horizontal cross-section. In one embodiment, the horizontal cross-sectional shapes of respective FIGS. 8A-8D may correspond to the vertical cross-sectional shapes of respective FIGS. 7A-7D.

Figure 9A:
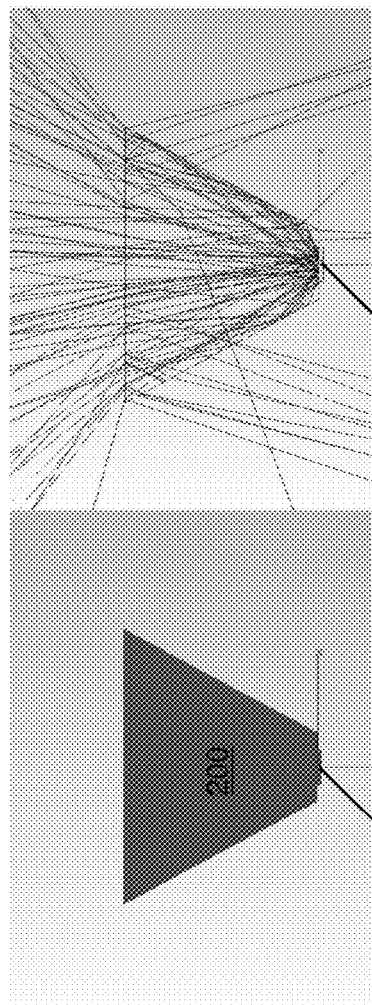
FIG. 9A is a diagram illustrating a light propagation and extraction modeling result with respect to a microlens having an inverted frusto-pyramidal shape and disposed over an LED, according to various embodiments of the present disclosure.
Figure 9B:
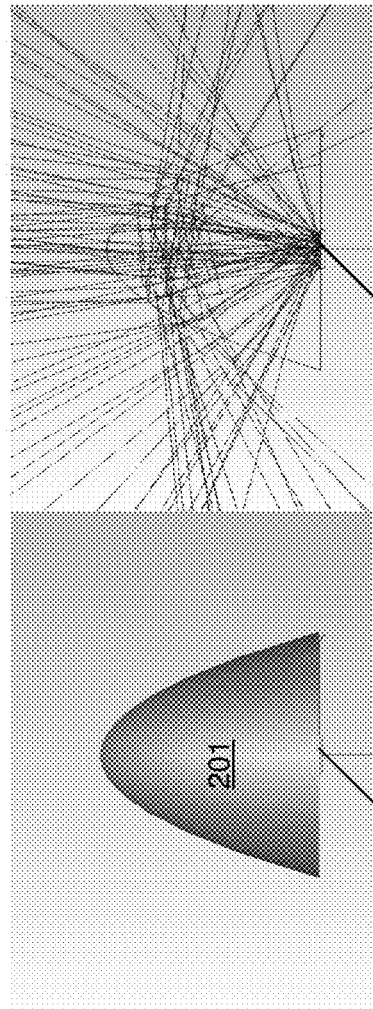
FIG. 9B is a diagram illustrating a light propagation and extraction modeling result with respect to a comparative microlens having an inverted frusto-pyramidal shape and disposed over an LED.

FIG. 9A is a diagram illustrating a light propagation and extraction modeling result with respect to a microlens 200 having an inverted frusto-pyramidal shape and disposed over an LED, according to various embodiments of the present disclosure. FIG. 9B is a diagram illustrating a light propagation and extraction modeling result with respect to a comparative microlens 201 having a conical shape and disposed over an LED 10.

As can be seen in FIG. 9A, the majority of the light propagates to the front surface of the microlens 200, with a lower amount backscattering. In contrast, as shown in FIG. 9B, the comparative microlens 201 had a higher amount of backscattering, due having a higher internal reflection. Accordingly, the exemplary microlens 200 provided better collimation and a lower amount of internal reflection, as compared to the comparative microlens 201. The present inventors also discovered that the internal reflection of the exemplary microlens 200 may be further reduced, by utilizing a convex front surface 204, as shown in FIG. 7D.

Figure 10:
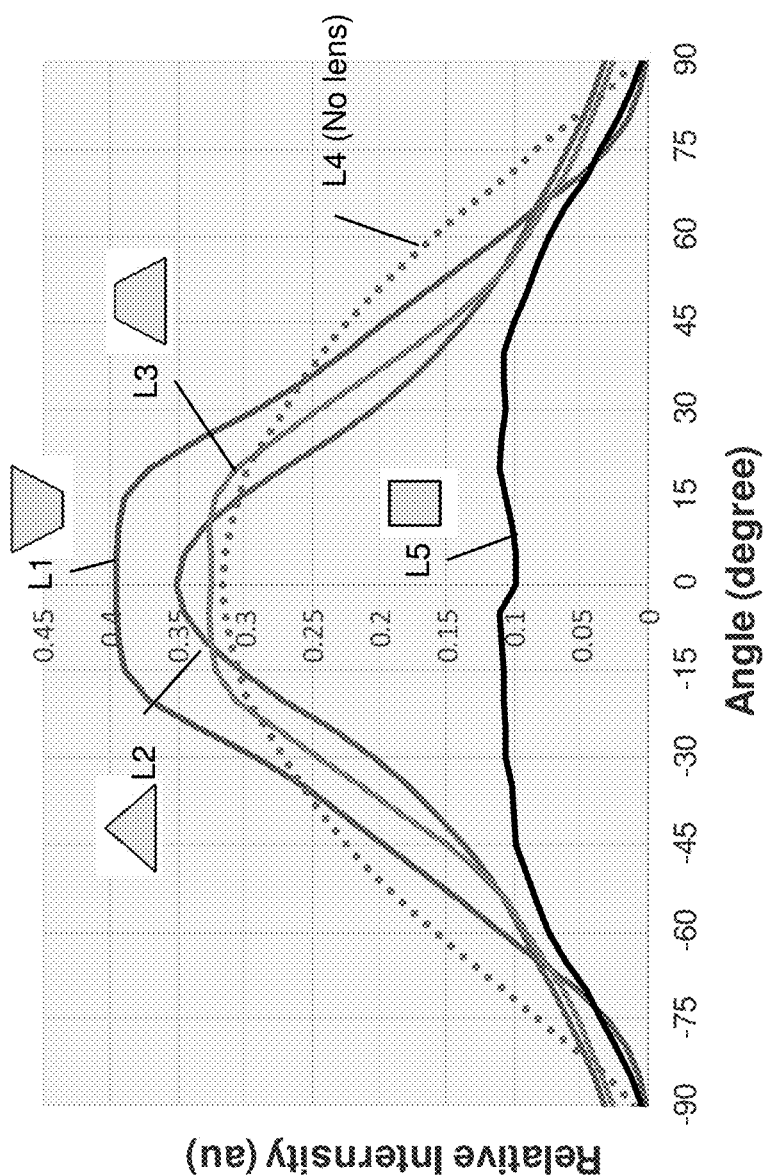
FIG. 10 is a graph showing relative angular intensities of light emitted from LEDs focused by microlenses having different shapes, with 0 degrees representing a line perpendicular to the light-emitting surface of a corresponding LED.

FIG. 10 is a graph showing a simulation of relative angular intensities of light emitted from LEDs focused by microlenses having different shapes, with 0 degrees representing a line perpendicular to the light-emitting surface of a corresponding LED. Referring to FIG. 10, the angular distribution of a microlens having a larger front surface 204 than back surface 202, such as a microlens having an inverted frusto-pyramidal shape, according to various embodiments of the present disclosure, provides the highest emission intensity along directions within +/−15 degrees of a direction normal to the emitting surface of an LED. Accordingly, the exemplary microlens provides the highest amount of collimation.

In contrast, the angular intensities of light focused by a pyramidal microlens (line L2) and a frusto-pyramidal microlens (line L3) shows only slightly higher collimation than light emitted from an LED that did not pass through a lens (line L4). In addition, light focused by a microlens having the same front and back surface area and vertical sidewall(s) (line L5) exhibits the lowest amount of collimation.

FIG. 11A shows photolithographic process for forming an array of microlenses using a positive photoresist. FIG. 11B shows another photolithographic process using a negative photoresist for forming an array of microlenses according to various embodiments of the present disclosure.

Referring to FIG. 11A, microlenses 200A having positively sloped sidewalls are formed over a support 111, such as a temporary substrate or the cover glass (e.g., element 230 shown in FIG. 6A). The microlenses 200A may be attached (e.g., bonded or glued) upside down over the transparent conductive layer 120 as shown in FIG. 6A. If the support 111 comprises a temporary substrate, then it is removed (e.g., detached or etched away) after attaching the microlenses 200A.

The microlenses 200A may be formed of a positive photoimagable (i.e., photosensitive) polymer material, such as a positive photoresist. The material is exposed to radiation (e.g., UV radiation) through a mask, and the exposed material is developed and removed. The height of the microlenses 200A may be controlled by controlling the viscosity, spin speed, and/or surface tension of a microlens precursor material. The final microlens curvature may be achieved after reflow of the lens material. Alternatively, the microlens material may comprise a non-photoimageable material (e.g., non-photosensitive polymer) located below a photoresist pattern. The microlens material is then taper etched into the shape shown in FIG. 11A using the photoresist pattern as a mask.

Referring to FIG. 11B, the microlenses 200B may be formed of a negative photoimagable (i.e., photosensitive) polymer material, such as a negative photoresist, over the transparent conductive layer 120 overlying the LEDs, as described above with respect to FIG. 6A. The un-crosslinked material is exposed to radiation (e.g., UV radiation) through a mask, and the exposed material is crosslinked, while the remaining un-crosslinked material is developed and removed. The microlenses 200B have negatively sloped sidewalls. The method may include utilizing shims (not shown) for wedge-error correction on a mask aligner (not shown), and a proximity gap may be maintained at a minimum distance, without making any contact with the negative photoresist. The method may also include applying a very low UV radiation exposure dose to the negative photoresist, and a relatively short post-exposure bake time to reduce the cross-linking. The method may also include a relatively long development time, to provide undercutting and form the negatively sloped (e.g., recessed) sidewalls of the microlenses 200B.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

The invention claimed is:

1. A light-emitting device, comprising:
a backplane;
light-emitting diodes (LEDs) located over a front side of the backplane;
microlenses respectively disposed over the LEDs, each microlens comprising:
a back surface having a first surface area and configured to receive light emitted from a corresponding LED;
an opposing front surface having a second surface area and configured to emit the received light; and
at least one sidewall extending from the front surface to the back surface,
wherein the second surface area is greater than the first surface area;
a dielectric matrix layer located over the front side of the backplane and laterally surrounding the LEDs; and
a transparent conductive layer contacting front surfaces of the LEDs.

2. The light-emitting device of claim 1, wherein the second surface area is at least 10% greater than the first surface area.

3. The light-emitting device of claim 1, wherein the at least one sidewall is planar.

4. The light-emitting device of claim 1, wherein the at least one sidewall is concave.

5. The light-emitting device of claim 1, wherein the at least one sidewall is convex.

6. The light-emitting device of claim 1, wherein:
the back surface is planar; and
the front surface is planar.

7. The light-emitting device of claim 1, wherein:
the back surface is planar; and
the front surface is convex.

8. The light-emitting device of claim 1, wherein the microlenses have a circular horizontal cross-section, taken in a plane parallel to a plane of the back surface.

9. The light-emitting device of claim 1, wherein the microlenses have a polygonal horizontal cross-section, taken in a plane parallel to a plane of the back surface.

10. The light-emitting device of claim 1, wherein the second surface area is greater than a surface area of an emission surface of the LEDs.

11. The light-emitting device of claim 1, wherein the microlenses comprise a polymer material.

12. The light-emitting device of claim 11, wherein the polymer material comprises a negative photoimagable polymer.

13. The light-emitting device of claim 12, wherein the polymer material comprises a negative photoresist.

14. The light-emitting device of claim 1, wherein the light-emitting device is a direct view display device, and wherein the LEDs include red, green, and blue light-emitting LEDs.

15. The light-emitting device of claim 1, wherein only one of the microlenses is disposed over each one of the respective LEDs.

16. A light-emitting device, comprising:
a backplane;
light-emitting diodes (LEDs) located over a front side of the backplane; and
microlenses comprising a polymer material respectively disposed over the LEDs, each microlens comprising:
a back surface having a first surface area and configured to receive light emitted from a corresponding LED;
an opposing front surface having a second surface area and configured to emit the received light; and
at least one sidewall extending from the front surface to the back surface,
wherein the second surface area is greater than the first surface area,
wherein the polymer material comprises a negative photoimagable polymer.

17. The light-emitting device of claim 16, wherein the polymer material comprises a negative photoresist.

* * * * *